(12) United States Patent
Nie

(10) Patent No.: US 10,056,037 B1
(45) Date of Patent: Aug. 21, 2018

(54) AMOLED PIXEL DRIVER CIRCUIT AND PIXEL DRIVING METHOD

(71) Applicant: Shenzhen China Star Optoelectronics Technology Co., Ltd., Shenzhen (CN)

(72) Inventor: Chenglei Nie, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 64 days.

(21) Appl. No.: 15/506,246

(22) PCT Filed: Dec. 20, 2016

(86) PCT No.: PCT/CN2016/110900
§ 371 (c)(1),
(2) Date: Feb. 24, 2017

(87) PCT Pub. No.: WO2018/068391
PCT Pub. Date: Apr. 19, 2018

(30) Foreign Application Priority Data

Oct. 14, 2016 (CN) .......................... 2016 1 0900286

(51) Int. Cl.
*G09G 3/32* (2016.01)
*G09G 3/3258* (2016.01)
*H01L 27/32* (2006.01)

(52) U.S. Cl.
CPC ....... *G09G 3/3258* (2013.01); *H01L 27/3262* (2013.01); *H01L 27/3265* (2013.01); *G09G 2300/0426* (2013.01); *G09G 2300/0809* (2013.01)

(58) Field of Classification Search
CPC .............. G09G 3/3258; G01L 27/3262; H01L 27/3265
USPC ........................................................... 345/82
See application file for complete search history.

(56) References Cited

U.S. PATENT DOCUMENTS

| 2005/0067970 | A1* | 3/2005 | Libsch ................. | G09G 3/3233 |
| | | | | 315/169.3 |
| 2007/0052647 | A1* | 3/2007 | Chen ..................... | G09G 3/3233 |
| | | | | 345/92 |
| 2012/0249510 | A1* | 10/2012 | Jankovic .............. | G09G 3/3233 |
| | | | | 345/211 |

(Continued)

FOREIGN PATENT DOCUMENTS

CN         105632419 A     6/2016

*Primary Examiner* — Jonathan Blancha
(74) *Attorney, Agent, or Firm* — Leong C. Lei

(57) ABSTRACT

The invention provides an AMOLED pixel driver circuit and pixel driving method. The AMOLED pixel driver circuit has a 6T1C structure, comprising a first thin film transistor (TFT) (T1), a second TFT (T2) forming mirror relation with the first TFT (T1), a third TFT (T3), a fourth TFT (T4), a fifth TFT (T5), a sixth TFT (T6), a capacitor (c1), and an organic light-emitting diode (OLED) (D1), and receiving a first scan signal (Scan1), a second scan signal (Scan2), a third scan signal (Scan3), a data signal (Data), and a predefined voltage (Vpre). The circuit can effectively compensate the threshold voltage of the driving TFT to solve the problem of unstable current flowing through the OLED caused by the threshold voltage drift. Moreover, the use of double-gate TFT as driving TFT allows designating the threshold voltage of the driving TFT through inputting predefined voltage.

12 Claims, 5 Drawing Sheets

(56) References Cited

U.S. PATENT DOCUMENTS

| | | | |
|---|---|---|---|
| 2014/0346968 A1* | 11/2014 | Meng | H05B 33/0896 |
| | | | 315/240 |
| 2015/0339974 A1* | 11/2015 | Wu | G09G 3/3233 |
| | | | 345/690 |
| 2016/0266702 A1* | 9/2016 | Yang | G09G 3/3241 |

* cited by examiner

AMOLED PIXEL DRIVER CIRCUIT AND PIXEL DRIVING METHOD

BACKGROUND OF THE INVENTION

1. Field of the Invention

The present invention relates to the field of display techniques, and in particular to an AMOLED pixel driver and pixel driving method.

2. The Related Arts

The organic light emitting diode (OLED) display provides the advantages of active light-emitting, low driving voltage, high emission efficiency, quick response time, high resolution and contrast, near 180° viewing angle, wide operation temperature range, and capability to realize flexible display and large-area full-color display, and is regarded as the most promising display technology.

The driving types of OLED can be divided, according to the driving method, into the passive matrix OLED (PMOLED) and active matrix OLED (AMOLED), i.e., the direct addressable type and thin film transistor (TFT) addressable type, wherein the AMOLED provides the advantages of pixels arranged in an array, self-luminous, and high luminous efficiency and is commonly used for high definition large-size display.

AMOLED is a current-driven device that emits light when a current flows through the OLED, and the light-emitting luminance is determined by the current flowing through the OLED. Most of the known integrated circuits (ICs) only transmit voltage signals, so the AMOLED pixel driver circuit needs to complete the task of converting the voltage signal into a current signal.

The known AMOLED pixel driver circuit is usually 2T1C structure, that is, two thin film transistors (TFTs) and a capacitor, to convert voltage to current; wherein one TFT is a switching TFT for controlling the entrance and exit of the data signal, and the other TFT is a driving TFT, for controlling the current flowing through the OLED. Therefore, the importance of the threshold voltage of the driving TFT is obvious. The positive or negative drift of the threshold voltage will cause different amount of current flowing through the OLED even with the same data signal. However, the known TFTs made of low-temperature polysilicon (LTPS) or oxide semiconductors are subject to threshold voltage drift due to light, source-drain voltage stress and other factors. In the known 2T1C structure circuit, the threshold voltage drift of the driving TFT cannot be improved by adjustment. Therefore, the influence of the threshold voltage drift needs to be relieved by introducing new TFTs or new signals so that the AMOLD pixel driver circuit has a compensation function.

Some of the known technologies use the single-gate TFT as the driving TFT in the AMOLED pixel driver circuit. By detecting the threshold voltage of the driving TFT, and then adjusting the data signal value of the required input according to the drift extent of the threshold voltage. The shortcoming of this type of circuit is that the threshold voltage of the known single-gate TFT is usually increased by drifting towards positive due to stresses, such as, voltage and lights. Therefore, the data signal should be increased accordingly to alleviate the influence of the threshold voltage drift. As the increase in the data signal further enhances the voltage stress on the driving TFT, which accelerates the threshold voltage drift, a vicious cycle is formed as a result.

SUMMARY OF THE INVENTION

The object of the present invention is to provide an AMOLED pixel driver circuit, able to effectively compensate the threshold voltage drift of the driving TFT, without adjusting the data signal to alleviate the threshold voltage drift of the driving TFT, to stabilize the current flowing through the OLED and to ensure even light-emitting of the OLED to improve display result.

Another object of the present invention is to provide an AMOLED pixel driving method, able to effectively compensate the threshold voltage change of the driving TFT to solve the problem of unstable current flowing through the OLED caused by the threshold voltage drift so as to ensure uniform light-emitting of the OLED to improve display result.

To achieve the above object, the present invention provides an AMOLED driver circuit, which comprises: a first thin film transistor (TFT), a second TFT, a third TFT, a fourth TFT, a fifth TFT, a sixth TFT, a capacitor, and an organic light-emitting diode (OLED); the first TFT being a double-gate TFT with the bottom gate connected to receive a predefined voltage and the top gate connected to a first node, the source connected to a second node and the drain connected to a power supply voltage; the second TFT being a double-gate TFT and forming a mirror relation with the first TFT, with the bottom gate connected to the drain of the sixth TFT, both the top gate and the drain connected to the first node, the source connected to the second node; the third TFT having the gate connected to a first scan signal, the source connected to the power supply voltage and the drain connected to the first node; the fourth TFT having the gate connected to a second scan signal, the source connected to a data signal and the drain connected to the second node; the fifth TFT having the gate connected to a third scan signal, the source connected to the second node and the drain connected to the anode of the OLED; the sixth TFT having the gate connected to the second scan signal, the source connected to the predefined voltage and the drain connected to the bottom gate of the second TFT; the capacitor having one end connected to the first node and the other end connected to the ground; the OLED having the anode connected to the second node and the cathode connected to ground; wherein the double-gated first TFT being for driving the OLED, the fourth TFT being for controlling the entrance of the data signal.

According to a preferred embodiment of the present invention, the first TFT, the second TFT, the third TFT, the fourth TFT, the fifth TFT and the sixth TFT are all low temperature polysilicon (LTPS) TFTs, oxide semiconductor TFTs or amorphous silicon (a-Si) TFTs.

According to a preferred embodiment of the present invention, the first scan signal, the second scan signal and the third scan signal are all provided by an external timing controller.

According to a preferred embodiment of the present invention, the predefined voltage is a constant voltage.

According to a preferred embodiment of the present invention, the first scan signal, the second scan signal, the third scan signal and the data signal are combined to correspond to, in sequence, a pre-charging phase, a threshold voltage programming design phase and a driving light-emitting phase; in the pre-charging phase, the first scan signal provides high level voltage, the second scan signal, the third scan signal and the data signal all provide low level voltage; in the threshold voltage programming design phase, the first scan signal provides low level voltage, the second scan signal, the third scan signal and the data signal all provide high level voltage; in the driving light-emitting phase, the first scan signal, the second scan signal and the data signal all provide low level voltage, and the third scan signal provides high level voltage.

Another embodiment of the present invention provides an AMOLED pixel driving method, which comprises: Step 1: providing an AMOLED pixel driver circuit, comprising: a first thin film transistor (TFT), a second TFT, a third TFT, a fourth TFT, a fifth TFT, a sixth TFT, a capacitor, and an organic light-emitting diode (OLED); the first TFT being a double-gate TFT with the bottom gate connected to receive a predefined voltage and the top gate connected to a first node, the source connected to a second node and the drain connected to a power supply voltage; the second TFT being a double-gate TFT and forming a mirror relation with the first TFT, with the bottom gate connected to the drain of the sixth TFT, both the top gate and the drain connected to the first node, the source connected to the second node; the third TFT having the gate connected to a first scan signal, the source connected to the power supply voltage and the drain connected to the first node; the fourth TFT having the gate connected to a second scan signal, the source connected to a data signal and the drain connected to the second node; the fifth TFT having the gate connected to a third scan signal, the source connected to the second node and the drain connected to the anode of the OLED; the sixth TFT having the gate connected to the second scan signal, the source connected to the predefined voltage and the drain connected to the bottom gate of the second TFT; the capacitor having one end connected to the first node and the other end connected to the ground; the OLED having the anode connected to the second node and the cathode connected to ground; wherein the double-gated first TFT being for driving the OLED, the fourth TFT being for controlling the entrance of the data signal; Step 2: entering a pre-charging phase: the first scan signal providing high level voltage to turn on the third TFT to charge the capacitor; the second scan signal providing low level voltage to cut off the fourth TFT and the sixth TFT; the third scan signal providing low level voltage to cut off the fifth TFT; the power supply voltage being written into the drain and the top gate of the second TFT, and the top gate of the first TFT; the predefined voltage being written into the bottom gate of the first TFT; and the data signal all provide low level voltage; Step 3: entering a threshold voltage programming design phase: the first scan signal providing low level voltage to cut off the third TFT to charge the capacitor; the second scan signal providing high level voltage to turn on the fourth TFT and the sixth TFT; the third scan signal providing high level voltage to turn on the fifth TFT; the predefined voltage being written into the bottom gate of the second TFT, the high level voltage provided by the data signal being written into the source of the first TFT and the source of the second TFT, the bottom gate of the first TFT remaining the predefined voltage; the second TFT is turned on, the voltages of the top gate and the drain of the second TFT, and the voltage of the top gate of the first TFT continuously dropping as the time passing, and the threshold voltages of the first TFT and the second TFT continuously rising as the time passing, the threshold voltages of the first TFT and the second TFT stopping changing when the threshold voltages of the first TFT and the second TFT reaching Vth=Vpre−Vdata, wherein Vth being the threshold voltages of the first TFT and the second TFT, Vpre being the predefined voltage and Vdata being the high level voltage provided by the data signal, at this point, the voltage of the top gates of the first TFT and the second TFT being stored in the capacitor; Step 4: entering a driving light-emitting phase: the first scan signal providing low level voltage and the third TFT remaining cut off; the second scan signal providing low level voltage to cut off the fourth TFT and the sixth TFT; the third scan signal providing high level voltage and the fifth TFT remaining turned on; the voltages of the top gate of the first TFT and the top gate of the second TFT remaining unchanged due to the storage of the capacitor, and the threshold voltage of the first TFT remaining Vth=Vpre−Vdata; The bottom gate of the first TFT remaining predefined voltage, the first TFT turned on, the source voltage of the first TFT becoming the voltage of the anode of the OLED, the OLED emitting light, and the current flowing through the OLED being independent of the threshold voltage of the first TFT.

According to a preferred embodiment of the present invention, the first TFT, the second TFT, the third TFT, the fourth TFT, the fifth TFT and the sixth TFT are all low temperature polysilicon (LTPS) TFTs, oxide semiconductor TFTs or amorphous silicon (a-Si) TFTs.

According to a preferred embodiment of the present invention, the first scan signal, the second scan signal and the third scan signal are all provided by an external timing controller.

According to a preferred embodiment of the present invention, the predefined voltage is a constant voltage.

Yet another embodiment of the present invention provides an AMOLED driver circuit, which comprises: a first thin film transistor (TFT), a second TFT, a third TFT, a fourth TFT, a fifth TFT, a sixth TFT, a capacitor, and an organic light-emitting diode (OLED); the first TFT being a double-gate TFT with the bottom gate connected to receive a predefined voltage and the top gate connected to a first node, the source connected to a second node and the drain connected to a power supply voltage; the second TFT being a double-gate TFT and forming a mirror relation with the first TFT, with the bottom gate connected to the drain of the sixth TFT, both the top gate and the drain connected to the first node, the source connected to the second node; the third TFT having the gate connected to a first scan signal, the source connected to the power supply voltage and the drain connected to the first node; the fourth TFT having the gate connected to a second scan signal, the source connected to a data signal and the drain connected to the second node; the fifth TFT having the gate connected to a third scan signal, the source connected to the second node and the drain connected to the anode of the OLED; the sixth TFT having the gate connected to the second scan signal, the source connected to the predefined voltage and the drain connected to the bottom gate of the second TFT; the capacitor having one end connected to the first node and the other end connected to the ground; the OLED having the anode connected to the second node and the cathode connected to ground; wherein the double-gated first TFT being for driving the OLED, the fourth TFT being for controlling the entrance of the data signal; wherein the first TFT, the second TFT, the third TFT, the fourth TFT, the fifth TFT and the sixth TFT being all low temperature polysilicon (LTPS) TFTs, oxide semiconductor TFTs or amorphous silicon (a-Si) TFTs; wherein the first scan signal, the second scan signal and the third scan signal being all provided by an external timing controller.

Compared to the known techniques, the present invention provides the following advantages. The present invention provides an AMOLED pixel driver circuit and pixel driving method, using double-gate TFT as the driving TFT. In the pre-charging phase, the first scan signal turns on the third TFT to write the power supply voltage into the top gate of the first TFT (i.e., the driving TFT) and the top gate of the second TFT. In the threshold voltage programming design phase, the second scan signal turns on the fourth TFT and the sixth TFT to lower the voltages of the top gates of the first TFT and the second TFT and raise the threshold voltages until the threshold voltages reaching Vth=Vpre−Vdata. In the driving light-emitting phase, the top gate voltage of the first TFT remains unchanged and the threshold voltage remains Vth=Vpre−Vdata, the predefined voltage turns on the first TFT to make the OLED emit light and the current flowing through the OLED is independent of the threshold voltage of the first TFT so as to ensure uniform luminance of the OLED and improve display result. Furthermore, the effect of stress of voltage and light on the threshold voltage of the double-gate TFT is smaller, and the threshold voltage of double-gate TFT has a negative correlation with the top gate voltage. The use of double-gate TFT as driving TFT allows designating the threshold voltage of the driving TFT through inputting predefined voltage, and can alleviate the threshold voltage drift of the driving TFT without adjusting the data signal. The present invention provides an AMOLED pixel driving method able to effectively compensate the threshold voltage change of the driving TFT to solve the problem of unstable current flowing through the OLED caused by the threshold voltage drift so as to ensure uniform light-emitting of the OLED to improve display result.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 1:
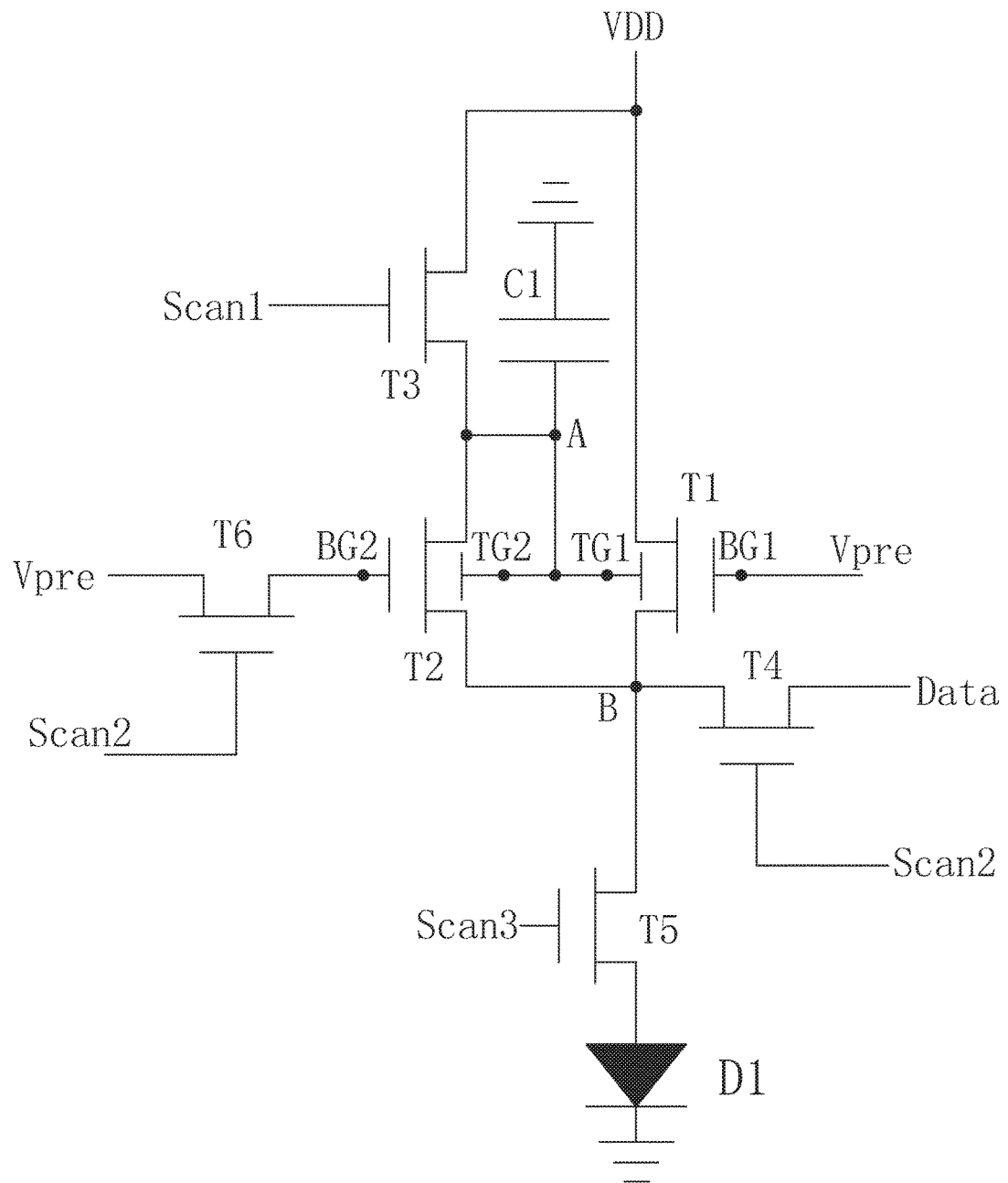
FIG. 1 is a schematic view showing a pixel driver circuit for AMOLED provided by the first embodiment of the present invention.
Figure 2:
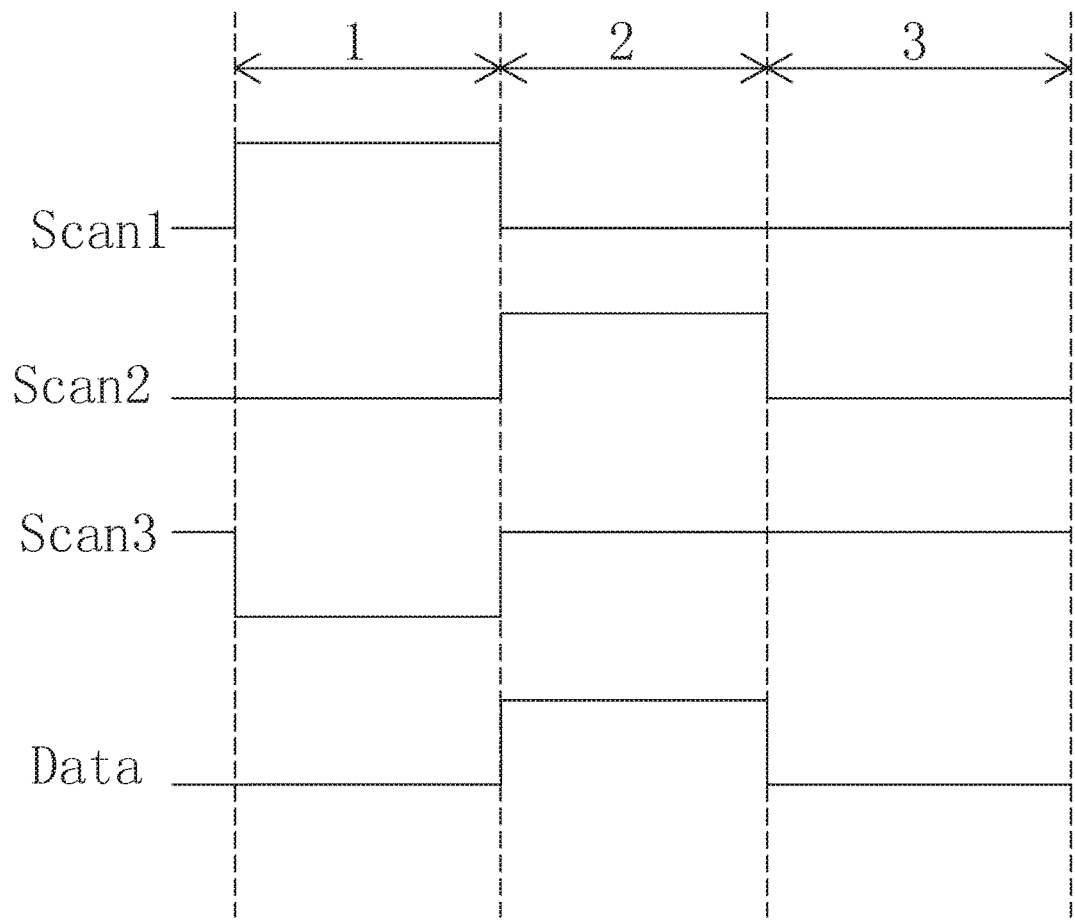
FIG. 2 is a schematic view showing the timing sequence of the pixel driver circuit for AMOLED provided by the first embodiment of the present invention.

Referring to FIG. 1 and FIG. 2, the present invention provides an AMOLED pixel driver circuit of 6T1C structure, which comprises: a first thin film transistor (TFT) T1, a second TFT T2, a third TFT T3, a fourth TFT T4, a fifth TFT T5, a sixth TFT T6, a capacitor C1, and an organic light-emitting diode (OLED) D1.

The first TFT T1 is a double-gate TFT, with the bottom gate BG1 connected to receive a predefined voltage Vpre and the top gate TG1 connected to a first node A, the source connected to a second node B and the drain connected to a power supply voltage VDD. The doubled-gated first TFT T1 is used as the driving TFT for driving the OLED D1. Based on the available research result, the double-gate TFT shows the characteristics of smaller effect on the threshold voltage caused by the stresses of voltage and light. Also, the threshold voltage of double-gate TFT has a negative correlation with the top gate voltage. In other words, the higher the top gate voltage, the lower the threshold voltage.

The second TFT T2 is a double-gate TFT and forms a mirror relation with the first TFT T1, with the bottom gate BG2 connected to the drain of the sixth TFT T6, both the top gate TG2 and the drain connected to the first node A, the source connected to the second node B. Because there is a mirror relation between the first TFT T1 and the second TFT T2, the two TFTs have the same threshold voltage when the two TFTs have the same top gate voltage.

The third TFT T3 has the gate connected to a first scan signal Scan1, the source connected to the power supply voltage VDD and the drain connected to the first node A.

The fourth TFT T4 has the gate connected to a second scan signal Scan2, the source connected to a data signal Data and the drain connected to the second node B. The fourth TFT T4 is for controlling the entrance of the data signal Data.

The fifth TFT T5 has the gate connected to a third scan signal Scan3, the source connected to the second node B and the drain connected to the anode of the OLED D1.

The sixth TFT T6 has the gate connected to the second scan signal Scan2, the source connected to the predefined voltage Vpre and the drain connected to the bottom gate BG2 of the second TFT T2.

The capacitor C1 has one end connected to the first node A and the other end connected to the ground.

The OLED D1 has the anode connected to the second node B and the cathode connected to ground.

Specifically, the first TFT T1, the second TFT T2, the third TFT T3, the fourth TFT T4, the fifth TFT T5 and the sixth TFT T6 are all low temperature polysilicon (LTPS) TFTs, oxide semiconductor TFTs or amorphous silicon (a-Si) TFTs.

Specifically, the first scan signal Scan1, the second scan signal Scan2 and the third scan signal Scan3 are all provided by an external timing controller.

Specifically, the predefined voltage Vpre is a constant voltage.

Specifically, referring to FIG. 2, the first scan signal Scan1, the second scan signal Scan2, the third scan signal Scan3 and the data signal Data are combined to correspond to, in sequence, a pre-charging phase 1, a threshold voltage programming design phase 2 and a driving light-emitting phase 3. In the pre-charging phase 1, the first scan signal Scan1 provides high level voltage, the second scan signal Scan2, the third scan signal Scan3 and the data signal Data all provide low level voltage. In the threshold voltage programming design phase 2, the first scan signal Scan1 provides low level voltage, the second scan signal Scan2, the third scan signal Scan3 and the data signal Data all provide high level voltage. In the driving light-emitting phase 3, the first scan signal Scan1, the second scan signal Scan2 and the data signal Data all provide low level voltage, and the third scan signal Scan3 provides high level voltage.

Furthermore, referring to FIG. 1 and FIG. 2, the operation of the process of the AMOLED pixel driver circuit of the present invention is as follows:

In the pre-charging phase 1: the first scan signal Scan1 provides high level voltage to turn on the third TFT T3 to charge the capacitor C1; the second scan signal Scan2 provides low level voltage to cut off the fourth TFT T4 and the sixth TFT T6; the third scan signal Scan3 provides low level voltage to cut off the fifth TFT T5; the power supply voltage VDD is written via the third TFT T3 into the top gate TG1 of the first TFT T1, and the drain and the top gate TG2 of the second TFT T2; the predefined voltage Vpre is written into the bottom gate BG1 of the first TFT T1; and the data signal Data provides low level voltage.

In the threshold voltage programming design phase 2: the first scan signal Scan1 provides low level voltage to cut off the third TFT T3; the second scan signal Scan2 provides high level voltage to turn on the fourth TFT T4 and the sixth TFT T6; the third scan signal Scan3 provides high level voltage to turn on the fifth TFT T5; the predefined voltage Vpre is written via the sixth TFT T6 into the bottom gate BG2 of second TFT T2, the high level voltage provided by the data signal Data is written into the source of the first TFT T1 and the source of the second TFT T2, the bottom gate BG1 of the first TFT T1 remains the predefined voltage Vpre; because the threshold voltage of double-gate TFT has a negative correlation with the top gate voltage, the threshold voltage of the first TFT T1 and the second TFT T2 is very small, and both the first TFT T1 and the second TFT T2 are turned on; as the time passes and the capacitor C1 discharges, the voltages of the top gate TG2 and the drain of the second TFT T2, and the voltage of the top gate TG1 of the first TFT T1 continuously drop, and the threshold voltages of the first TFT T1 and the second TFT T2 continuously rises; the threshold voltages of the first TFT T1 and the second TFT T2 stops changing when the threshold voltages of the first TFT T1 and the second TFT T2 reaches Vth=$V_{BG}$−Vs, i.e., Vth=Vpre−Vdata, wherein $V_{BG}$ is the bottom gate voltage of the first TFT T1 and the second TFT T2, Vs is the source voltage of the first TFT T1 and the second TFT T2, Vth is the threshold voltages of the first TFT T1 and the second TFT T2, and Vdata is the high level voltage provided by the data signal Data, at this point, the voltage of the top gates $V_{TG}$ of the first TFT T1 and the second TFT T2 is g stored in the capacitor C1. It should be noted that in the threshold voltage programming design phase 2, because the influence on the threshold voltage of double-gate TFT caused by the stresses of voltage and light is less and the threshold voltage of double-gate TFT has a negative correlation with the top gate voltage, the use of double-gate TFT as driving TFT allows designating the threshold voltage of the driving TFT through inputting predefined voltage, and can alleviate the threshold voltage drift of the driving TFT without adjusting the data signal Data.

In the driving light-emitting phase 3: the first scan signal Scan1 provides low level voltage and the third TFT T3 remains cut off; the second scan signal Scan2 provides low level voltage to cut off the fourth TFT T4 and the sixth TFT T6; the third scan signal Scan3 provides high level voltage and the fifth TFT T5 remains turned on; the voltages of the top gate TG1 of the first TFT T1 and the top gate TG2 of the second TFT T2 remain unchanged due to the storage of the capacitor C1, and the threshold voltage of the first TFT T1 remains Vth=Vpre−Vdata; The bottom gate BG1 of the first TFT T1 remains predefined voltage Vpre, the first TFT T1 is turned on, the source voltage of the first TFT T1 becomes the voltage of the anode $V_{OLED}$ of the OLED D1, and the OLED emits light.

Furthermore, the equation to compute the current flowing through the OLED is:

$$I = \beta(V_{BG} - Vth - V_S)^2$$

$$= \beta(V\text{pre} - V\text{pre} + V\text{data} - V_{OLED})^2$$

$$= \beta(V\text{data} - V_{OLED})^2$$

Wherein is a constant coefficient related to the TFT characteristics.

As shown, the current flowing through the OLED D1 is independent of the threshold voltage Vth of the first TFT T1. The compensation of the threshold voltage drift of the driving TFT also solves the problem of unstable current flowing through the OLED caused by the threshold voltage drift so as to ensure uniform light-emitting of the OLED to improve display result.

Figure 3:
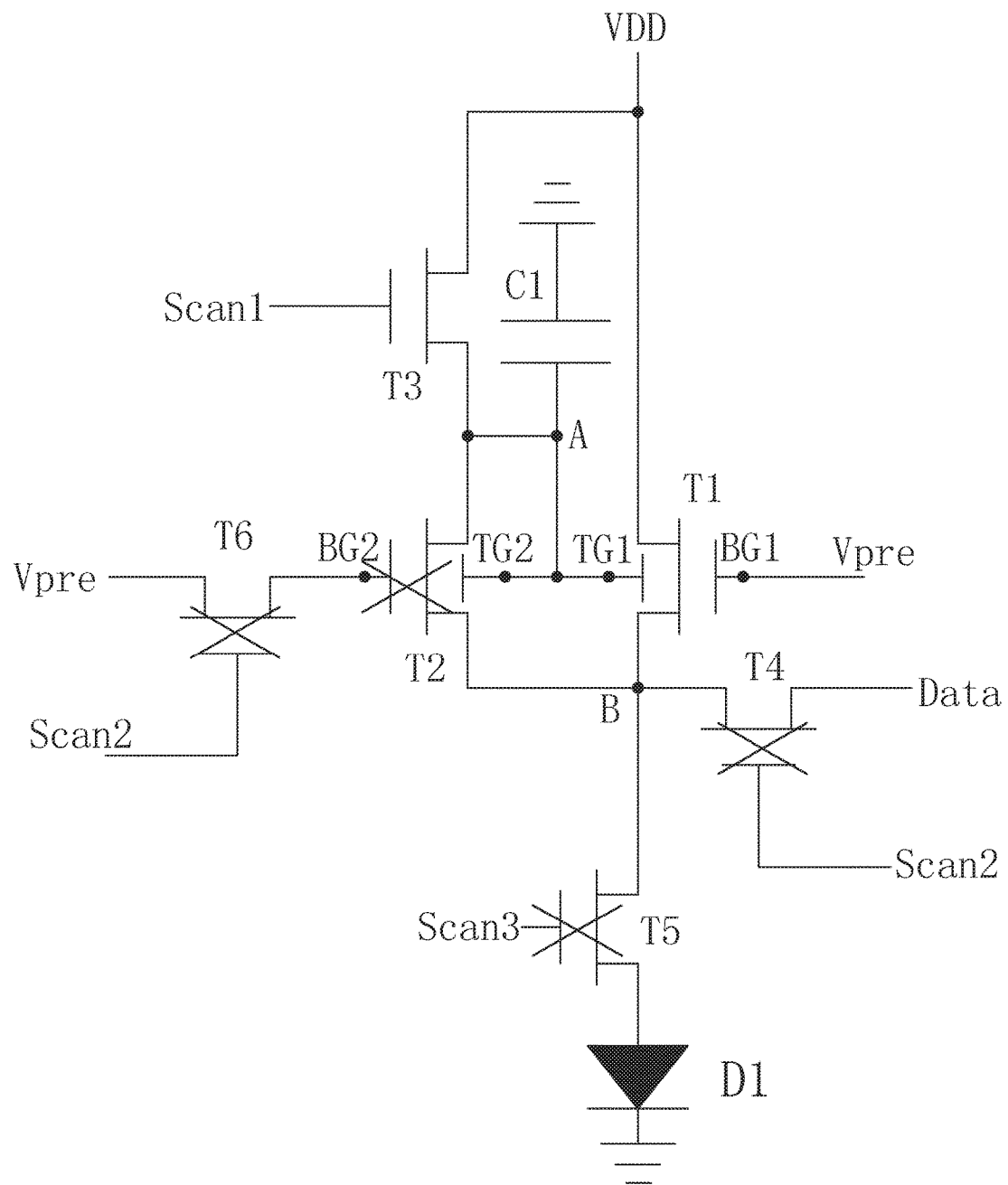
FIG. 3 is a schematic view showing Step 2 of the AMOLED pixel driving method provided by an second embodiment of the present invention.
Figure 4:
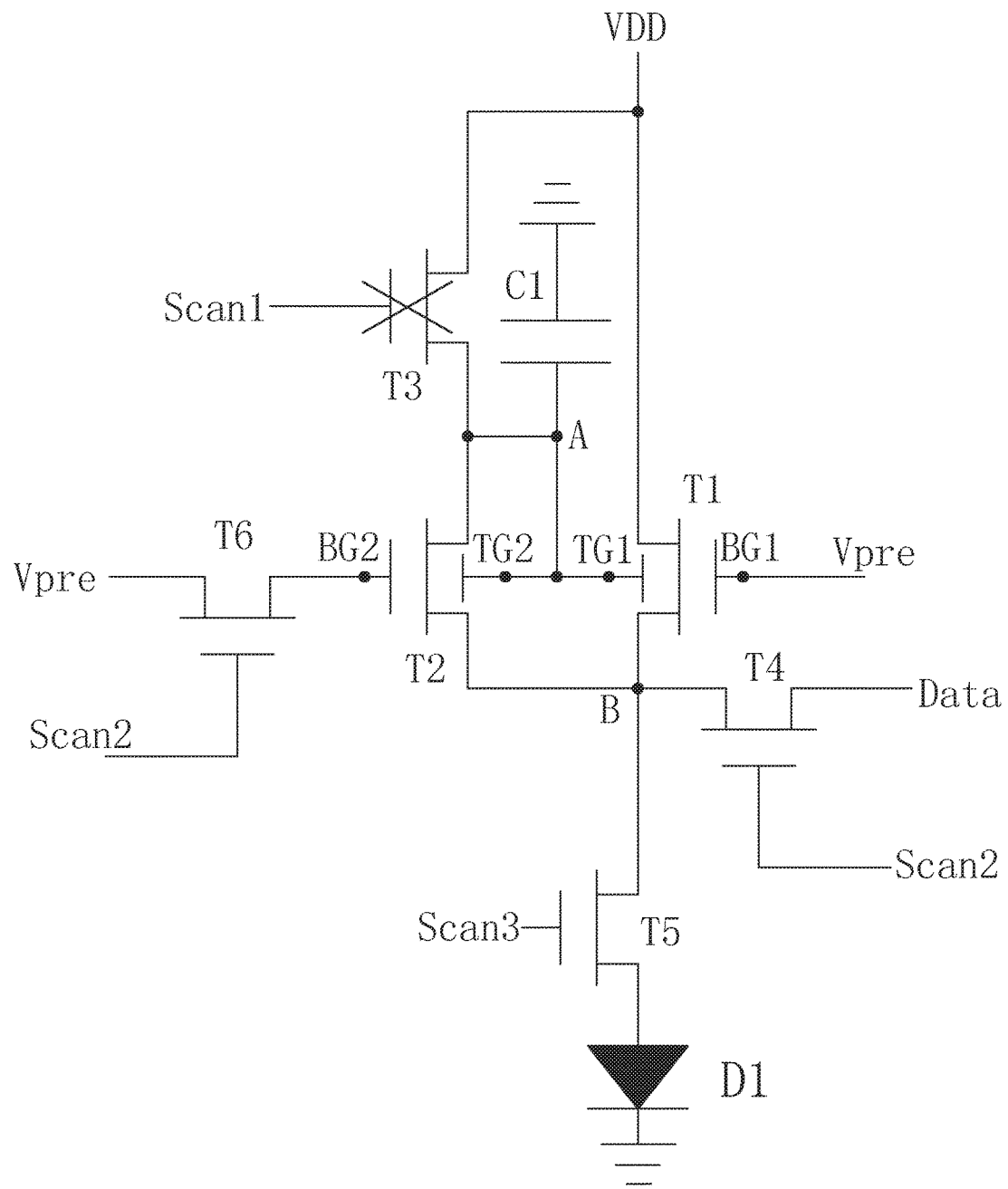
FIG. 4 is a schematic view showing Step 3 of the AMOLED pixel driving method provided by an second embodiment of the present invention.
Figure 5:
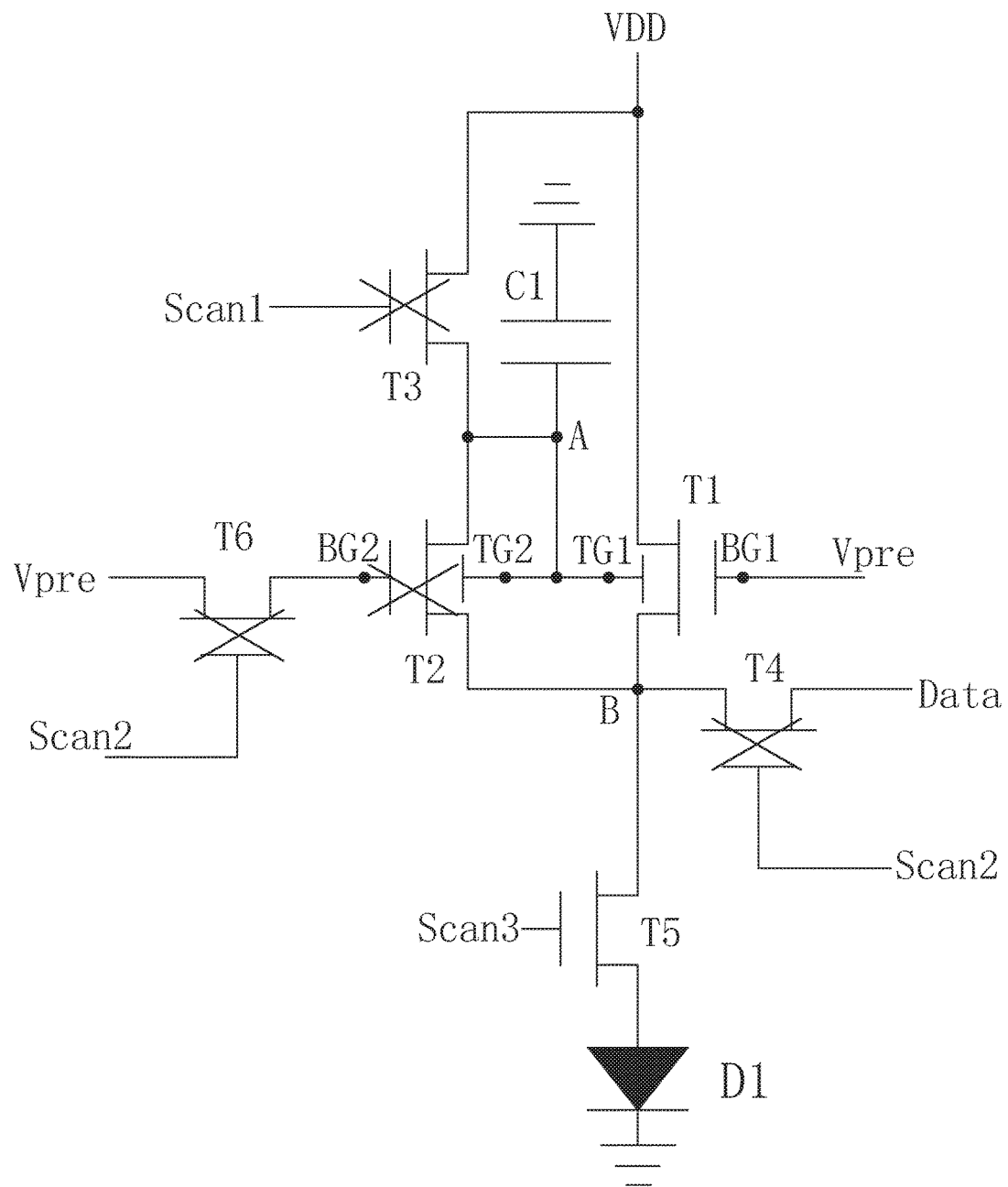
FIG. 5 is a schematic view showing Step 4 of the AMOLED pixel driving method provided by an second embodiment of the present invention.

Refer to FIGS. 3-5, in combination with FIGS. 1-2. Based on the aforementioned AMOLED pixel driver circuit, the present invention also provides an AMOLED pixel driving method, which comprises the following steps:

Step 1: Providing an AMOLED Pixel Driver Circuit.

The AMOLED pixel driver circuit comprises: a first thin film transistor (TFT) T1, a second TFT T2, a third TFT T3, a fourth TFT T4, a fifth TFT T5, a sixth TFT T6, a capacitor C1, and an organic light-emitting diode (OLED) D1. The double-gate TFT shows the characteristics of smaller effect on the threshold voltage caused by the stresses of voltage and light. Also, the threshold voltage of double-gate TFT has a negative correlation with the top gate voltage. In other words, the higher the top gate voltage, the lower the threshold voltage.

The first TFT T1 is a double-gate TFT, with the bottom gate BG1 connected to receive a predefined voltage Vpre and the top gate TG1 connected to a first node A, the source connected to a second node B and the drain connected to a power supply voltage VDD. The doubled-gated first TFT T1 is used as the driving TFT for driving the OLED D1.

The second TFT T2 is a double-gate TFT and forms a mirror relation with the first TFT T1, with the bottom gate BG2 connected to the drain of the sixth TFT T6, both the top gate TG2 and the drain connected to the first node A, the source connected to the second node B. Because there is a mirror relation between the first TFT T1 and the second TFT T2, the two TFTs have the same threshold voltage when the two TFTs have the same top gate voltage.

The third TFT T3 has the gate connected to a first scan signal Scan1, the source connected to the power supply voltage VDD and the drain connected to the first node A.

The fourth TFT T4 has the gate connected to a second scan signal Scan2, the source connected to a data signal Data and the drain connected to the second node B. The fourth TFT T4 is for controlling the entrance of the data signal Data.

The fifth TFT T5 has the gate connected to a third scan signal Scan3, the source connected to the second node B and the drain connected to the anode of the OLED D1.

The sixth TFT T6 has the gate connected to the second scan signal Scan2, the source connected to the predefined voltage Vpre and the drain connected to the bottom gate BG2 of the second TFT T2.

The capacitor C1 has one end connected to the first node A and the other end connected to the ground.

The OLED D1 has the anode connected to the second node B and the cathode connected to ground.

Specifically, the first TFT T1, the second TFT T2, the third TFT T3, the fourth TFT T4, the fifth TFT T5 and the sixth TFT T6 are all low temperature polysilicon (LTPS) TFTs, oxide semiconductor TFTs or amorphous silicon (a-Si) TFTs.

Specifically, the first scan signal Scan1, the second scan signal Scan2 and the third scan signal Scan3 are all provided by an external timing controller.

Specifically, the predefined voltage Vpre is a constant voltage.

Step 2: Entering Pre-Charging Phase 1.

The first scan signal Scan1 provides high level voltage to turn on the third TFT T3 to charge the capacitor C1; the second scan signal Scan2 provides low level voltage to cut off the fourth TFT T4 and the sixth TFT T6; the third scan signal Scan3 provides low level voltage to cut off the fifth TFT T5; the power supply voltage VDD is written via the third TFT T3 into the top gate TG1 of the first TFT T1, and the drain and the top gate TG2 of the second TFT T2; the predefined voltage Vpre is written into the bottom gate BG1 of the first TFT T1; and the data signal Data provides low level voltage.

Step 3: Entering Threshold Voltage Programming Design Phase 2.

The first scan signal Scan1 provides low level voltage to cut off the third TFT T3; the second scan signal Scan2 provides high level voltage to turn on the fourth TFT T4 and the sixth TFT T6; the third scan signal Scan3 provides high level voltage to turn on the fifth TFT T5; the predefined voltage Vpre is written via the sixth TFT T6 into the bottom gate BG2 of second TFT T2, the high level voltage provided by the data signal Data is written into the source of the first TFT T1 and the source of the second TFT T2, the bottom gate BG1 of the first TFT T1 remains the predefined voltage Vpre; because the threshold voltage of double-gate TFT has a negative correlation with the top gate voltage, the threshold voltage of the first TFT T1 and the second TFT T2 is very small, and both the first TFT T1 and the second TFT T2 are turned on; as the time passes and the capacitor C1 discharges, the voltages of the top gate TG2 and the drain of the second TFT T2, and the voltage of the top gate TG1 of the first TFT T1 continuously drop, and the threshold voltages of the first TFT T1 and the second TFT T2 continuously rises; the threshold voltages of the first TFT T1 and the second TFT T2 stops changing when the threshold voltages of the first TFT T1 and the second TFT T2 reaches Vth=$V_{BG}$-Vs, i.e., Vth=Vpre−Vdata, wherein $V_{BG}$ is the bottom gate voltage of the first TFT T1 and the second TFT T2, Vs is the source voltage of the first TFT T1 and the second TFT T2, Vth is the threshold voltages of the first TFT T1 and the second TFT T2, and Vdata is the high level voltage provided by the data signal Data, at this point, the voltage of the top gates $V_{TG}$ of the first TFT T1 and the second TFT T2 is g stored in the capacitor C1.

It should be noted that in Step 3, because the influence on the threshold voltage of double-gate TFT caused by the stresses of voltage and light is less and the threshold voltage of double-gate TFT has a negative correlation with the top gate voltage, the use of double-gate TFT as driving TFT allows designating the threshold voltage of the driving TFT through inputting predefined voltage, and can alleviate the threshold voltage drift of the driving TFT without adjusting the data signal Data.

Step 4: Entering Driving Light-Emitting Phase 3.

The first scan signal Scan1 provides low level voltage and the third TFT T3 remains cut off; the second scan signal Scan2 provides low level voltage to cut off the fourth TFT T4 and the sixth TFT T6; the third scan signal Scan3 provides high level voltage and the fifth TFT T5 remains turned on; the voltages of the top gate TG1 of the first TFT T1 and the top gate TG2 of the second TFT T2 remain unchanged due to the storage of the capacitor C1, and the threshold voltage of the first TFT T1 remains Vth=Vpre−Vdata; The bottom gate BG1 of the first TFT T1 remains predefined voltage Vpre, the first TFT T1 is turned on, the source voltage of the first TFT T1 becomes the voltage of the anode $V_{OLED}$ of the OLED D1, and the OLED emits light.

Furthermore, the equation to compute the current flowing through the OLED is:

$$I=\beta(V_{BG}-Vth-V_S)^2$$

$$=\beta(V\text{pre}-V\text{pre}+V\text{data}-V_{OLED})^2$$

$$=\beta(V\text{data}-V_{OLED})^2$$

Wherein is a constant coefficient related to the TFT characteristics.

As shown, the current flowing through the OLED D1 is independent of the threshold voltage Vth of the first TFT T1. The compensation of the threshold voltage drift of the driving TFT also solves the problem of unstable current flowing through the OLED caused by the threshold voltage drift so as to ensure uniform light-emitting of the OLED to improve display result.

In summary, the present invention provides an AMOLED pixel driver circuit and pixel driving method, using double-gate TFT as the driving TFT. In the pre-charging phase, the first scan signal turns on the third TFT to write the power supply voltage into the top gate of the first TFT (i.e., the driving TFT) and the top gate of the second TFT. In the threshold voltage programming design phase, the second scan signal turns on the fourth TFT and the sixth TFT to lower the voltages of the top gates of the first TFT and the second TFT and raise the threshold voltages until the threshold voltages reaching Vth=Vpre−Vdata. In the driving light-emitting phase, the top gate voltage of the first TFT remains unchanged and the threshold voltage remains Vth=Vpre−Vdata, the predefined voltage turns on the first TFT to make the OLED emit light and the current flowing through the OLED is independent of the threshold voltage of the first TFT so as to ensure uniform luminance of the OLED and improve display result. Furthermore, the effect of stress of voltage and light on the threshold voltage of the double-gate TFT is smaller, and the threshold voltage of double-gate TFT has a negative correlation with the top gate voltage. The use of double-gate TFT as driving TFT allows designating the threshold voltage of the driving TFT through inputting predefined voltage, and can alleviate the threshold voltage drift of the driving TFT without adjusting the data signal. The present invention provides an AMOLED pixel driving method able to effectively compensate the threshold voltage change of the driving TFT to solve the problem of unstable current flowing through the OLED caused by the threshold voltage drift so as to ensure uniform light-emitting of the OLED to improve display result.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An active matrix organic light-emitting diode (AMOLED) pixel driver circuit, which comprises:
a first thin film transistor (TFT), a second TFT, a third TFT, a fourth TFT, a fifth TFT, a sixth TFT, a capacitor, and an organic light-emitting diode (OLED);
the first TFT being a double-gate TFT with the bottom gate connected to receive a predefined voltage and the top gate connected to a first node, the source connected to a second node and the drain connected to a power supply voltage;
the second TFT being a double-gate TFT and forming a mirror relation with the first TFT, with the bottom gate connected to the drain of the sixth TFT, both the top gate and the drain connected to the first node, the source connected to the second node;
the third TFT having the gate connected to a first scan signal, the source connected to the power supply voltage and the drain connected to the first node;
the fourth TFT having the gate connected to a second scan signal, the source connected to a data signal and the drain connected to the second node;
the fifth TFT having the gate connected to a third scan signal, the source connected to the second node and the drain connected to the anode of the OLED;
the sixth TFT having the gate connected to the second scan signal, the source connected to the predefined voltage and the drain connected to the bottom gate of the second TFT;
the capacitor having one end connected to the first node and the other end connected to the ground;
the OLED having the anode connected to the second node and the cathode connected to ground;
wherein the double-gated first TFT being for driving the OLED, the fourth TFT being for controlling the entrance of the data signal.

2. The AMOLED pixel driver circuit as claimed in claim 1, wherein the first TFT, the second TFT, the third TFT, the fourth TFT, the fifth TFT and the sixth TFT are all low temperature polysilicon (LTPS) TFTs, oxide semiconductor TFTs or amorphous silicon (a-Si) TFTs.

3. The AMOLED pixel driver circuit as claimed in claim 1, wherein the first scan signal, the second scan signal and the third scan signal are all provided by an external timing controller.

4. The AMOLED pixel driver circuit as claimed in claim 1, wherein the predefined voltage is a constant voltage.

5. The AMOLED pixel driver circuit as claimed in claim 1, wherein the first scan signal, the second scan signal, the third scan signal and the data signal are combined to correspond to, in sequence, a pre-charging phase, a threshold voltage programming design phase and a driving light-emitting phase;
in the pre-charging phase, the first scan signal provides high level voltage, the second scan signal, the third scan signal and the data signal all provide low level voltage;
in the threshold voltage programming design phase, the first scan signal provides low level voltage, the second scan signal, the third scan signal and the data signal all provide high level voltage;
in the driving light-emitting phase, the first scan signal, the second scan signal and the data signal all provide low level voltage, and the third scan signal provides high level voltage.

6. An active matrix organic light-emitting diode (AMOLED) pixel driving method, which comprises:
Step 1: providing an AMOLED pixel driver circuit, comprising: a first thin film transistor (TFT), a second TFT, a third TFT, a fourth TFT, a fifth TFT, a sixth TFT, a capacitor, and an organic light-emitting diode (OLED);
the first TFT being a double-gate TFT with the bottom gate connected to receive a predefined voltage and the top gate connected to a first node, the source connected to a second node and the drain connected to a power supply voltage;
the second TFT being a double-gate TFT and forming a mirror relation with the first TFT, with the bottom gate connected to the drain of the sixth TFT, both the top gate and the drain connected to the first node, the source connected to the second node;
the third TFT having the gate connected to a first scan signal, the source connected to the power supply voltage and the drain connected to the first node;
the fourth TFT having the gate connected to a second scan signal, the source connected to a data signal and the drain connected to the second node;
the fifth TFT having the gate connected to a third scan signal, the source connected to the second node and the drain connected to the anode of the OLED;
the sixth TFT having the gate connected to the second scan signal, the source connected to the predefined voltage and the drain connected to the bottom gate of the second TFT;
the capacitor having one end connected to the first node and the other end connected to the ground;
the OLED having the anode connected to the second node and the cathode connected to ground;
wherein the double-gated first TFT being for driving the OLED, the fourth TFT being for controlling the entrance of the data signal;
Step 2: entering a pre-charging phase:
the first scan signal providing high level voltage to turn on the third TFT to charge the capacitor; the second scan signal providing low level voltage to cut off the fourth TFT and the sixth TFT; the third scan signal providing low level voltage to cut off the fifth TFT; the power supply voltage being written into the drain and the top gate of the second TFT, and the top gate of the first TFT; the predefined voltage being written into the bottom gate of the first TFT; and the data signal all provide low level voltage;
Step 3: entering a threshold voltage programming design phase:
the first scan signal providing low level voltage to cut off the third TFT to charge the capacitor; the second scan signal providing high level voltage to turn on the fourth TFT and the sixth TFT; the third scan signal providing high level voltage to turn on the fifth TFT; the predefined voltage being written into the bottom gate of the second TFT, the high level voltage provided by the data signal being written into the source of the first TFT and the source of the second TFT, the bottom gate of the first TFT remaining the predefined voltage; the second TFT is turned on, the voltages of the top gate and the drain of the second TFT, and the voltage of the top gate of the first TFT continuously dropping as the time passing, and the threshold voltages of the first TFT and the second TFT continuously rising as the time passing, the threshold voltages of the first TFT and the second TFT stopping changing when the threshold voltages of the first TFT and the second TFT reaching Vth=Vpre−Vdata, wherein Vth being the threshold voltages of the first TFT and the second TFT, Vpre being the predefined voltage and Vdata being the high level voltage provided by the data signal, at this point, the voltage of the top gates of the first TFT and the second TFT being stored in the capacitor;

Step 4: entering a driving light-emitting phase:

the first scan signal providing low level voltage and the third TFT remaining cut off; the second scan signal providing low level voltage to cut off the fourth TFT and the sixth TFT; the third scan signal providing high level voltage and the fifth TFT remaining turned on; the voltages of the top gate of the first TFT and the top gate of the second TFT remaining unchanged due to the storage of the capacitor, and the threshold voltage of the first TFT remaining Vth=Vpre−Vdata; The bottom gate of the first TFT remaining predefined voltage, the first TFT turned on, the source voltage of the first TFT becoming the voltage of the anode of the OLED, the OLED emitting light, and the current flowing through the OLED being independent of the threshold voltage of the first TFT.

7. The AMOLED pixel driving method as claimed in claim 6, wherein the first TFT, the second TFT, the third TFT, the fourth TFT, the fifth TFT and the sixth TFT are all low temperature polysilicon (LTPS) TFTs, oxide semiconductor TFTs or amorphous silicon (a-Si) TFTs.

8. The AMOLED pixel driving method as claimed in claim 6, wherein the first scan signal, the second scan signal and the third scan signal are all provided by an external timing controller.

9. The AMOLED pixel driving method as claimed in claim 6, wherein the predefined voltage is a constant voltage.

10. An active matrix organic light-emitting diode (AMOLED) pixel driver circuit, which comprises:

a first thin film transistor (TFT), a second TFT, a third TFT, a fourth TFT, a fifth TFT, a sixth TFT, a capacitor, and an organic light-emitting diode (OLED);

the first TFT being a double-gate TFT with the bottom gate connected to receive a predefined voltage and the top gate connected to a first node, the source connected to a second node and the drain connected to a power supply voltage;

the second TFT being a double-gate TFT and forming a mirror relation with the first TFT, with the bottom gate connected to the drain of the sixth TFT, both the top gate and the drain connected to the first node, the source connected to the second node;

the third TFT having the gate connected to a first scan signal, the source connected to the power supply voltage and the drain connected to the first node;

the fourth TFT having the gate connected to a second scan signal, the source connected to a data signal and the drain connected to the second node;

the fifth TFT having the gate connected to a third scan signal, the source connected to the second node and the drain connected to the anode of the OLED;

the sixth TFT having the gate connected to the second scan signal, the source connected to the predefined voltage and the drain connected to the bottom gate of the second TFT;

the capacitor having one end connected to the first node and the other end connected to the ground;

the OLED having the anode connected to the second node and the cathode connected to ground;

wherein the double-gated first TFT being for driving the OLED, the fourth TFT being for controlling the entrance of the data signal;

wherein the first TFT, the second TFT, the third TFT, the fourth TFT, the fifth TFT and the sixth TFT being all low temperature polysilicon (LTPS) TFTs, oxide semiconductor TFTs or amorphous silicon (a-Si) TFTs;

wherein the first scan signal, the second scan signal and the third scan signal being all provided by an external timing controller.

11. The AMOLED pixel driver circuit as claimed in claim 10, wherein the predefined voltage is a constant voltage.

12. The AMOLED pixel driver circuit as claimed in claim 10, wherein the first scan signal, the second scan signal, the third scan signal and the data signal are combined to correspond to, in sequence, a pre-charging phase, a threshold voltage programming design phase and a driving light-emitting phase;

in the pre-charging phase, the first scan signal provides high level voltage, the second scan signal, the third scan signal and the data signal all provide low level voltage;

in the threshold voltage programming design phase, the first scan signal provides low level voltage, the second scan signal, the third scan signal and the data signal all provide high level voltage;

in the driving light-emitting phase, the first scan signal, the second scan signal and the data signal all provide low level voltage, and the third scan signal provides high level voltage.

* * * * *